United States Patent
Pfeuffer et al.

(10) Patent No.: US 9,562,958 B2
(45) Date of Patent: *Feb. 7, 2017

(54) DETERMINATION OF A MAGNETIC RESONANCE SYSTEM ACTIVATION SEQUENCE

(71) Applicant: Siemens Aktiengesellschaft, München (DE)

(72) Inventors: Josef Pfeuffer, Kunreuth (DE); Rainer Schneider, Höchstadt (DE)

(73) Assignee: Siemens Aktiengesellschaft, München (DE)

( * ) Notice: Subject to any disclaimer, the term of this patent is extended or adjusted under 35 U.S.C. 154(b) by 922 days.

This patent is subject to a terminal disclaimer.

(21) Appl. No.: 13/847,373

(22) Filed: Mar. 19, 2013

(65) Prior Publication Data
US 2013/0253876 A1    Sep. 26, 2013

(30) Foreign Application Priority Data

Mar. 20, 2012  (DE) .................... 10 2012 204 401
Jul. 16, 2012   (DE) .................... 10 2012 212 376

(51) Int. Cl.
*G01R 33/44* (2006.01)
*G01R 33/38* (2006.01)
(Continued)

(52) U.S. Cl.
CPC ............. *G01R 33/443* (2013.01); *G01R 33/38* (2013.01); *G01R 33/4833* (2013.01);
(Continued)

(58) Field of Classification Search
CPC ............ G01R 33/4836; G01R 33/4833; G01R 33/5612; G01R 33/28; G01R 33/38; G01R 33/443; G01R 33/543; G01R 33/4818; G01R 33/56563
(Continued)

(56) References Cited

U.S. PATENT DOCUMENTS 4,694,250 A    9/1987  Iwaoka et al.
6,242,916 B1   6/2001  King
(Continued)

FOREIGN PATENT DOCUMENTS

CN       102210587 A      10/2011
DE   102012212376 B3       8/2013
(Continued)

OTHER PUBLICATIONS

German Office Action dated Jan. 31, 2013 for corresponding German Patent No. DE 10 2012 212 376.8 with English translation.
(Continued)

*Primary Examiner* — Melissa Koval
*Assistant Examiner* — Rishi Patel
(74) *Attorney, Agent, or Firm* — Lempia Summerfield Katz LLC

(57) ABSTRACT

A method and a control sequence determination device for the determination of a magnetic resonance system activation sequence including at least one high-frequency pulse sequence to be transmitted by a magnetic resonance system are provided. A current $B_0$ map and optionally a target magnetization are acquired. In addition, a k-space trajectory type is determined. An error density is calculated in a k-space based on the current $B_0$ map and optionally based on the target magnetization using an analytic function. This analytic function defines an error density in the k-space as a function of the current $B_0$ map and optionally the target magnetization. Taking account of the error density in the k-space, a k-space trajectory of the specified k-space trajectory type is determined. The high-frequency pulse sequence is determined for the k-space trajectory in an HF pulse optimization process.

19 Claims, 7 Drawing Sheets

(51) Int. Cl.
*G01R 33/483* (2006.01)
*G01R 33/561* (2006.01)
*G01R 33/565* (2006.01)

(52) U.S. Cl.
CPC ... *G01R 33/5612* (2013.01); *G01R 33/56563* (2013.01); *G01R 33/4836* (2013.01)

(58) Field of Classification Search
USPC .................................................. 324/300–322
See application file for complete search history.

(56) References Cited

U.S. PATENT DOCUMENTS

| | | | |
|---|---|---|---|
| 7,466,131 | B1 | 12/2008 | Xu et al. |
| 7,945,305 | B2 | 5/2011 | Aggarwal et al. |
| 9,274,195 | B2 * | 3/2016 | Pfeuffer ............ G01R 33/4833 |
| 2003/0191386 | A1 | 10/2003 | Heid |
| 2005/0110487 | A1 | 5/2005 | Zhu |
| 2008/0012563 | A1 | 1/2008 | Weiss et al. |
| 2010/0013478 | A1 | 1/2010 | Abe et al. |
| 2010/0052678 | A1 | 3/2010 | Heid et al. |
| 2010/0090694 | A1 | 4/2010 | Heid et al. |
| 2011/0241680 | A1 | 10/2011 | Mossnang et al. |
| 2012/0176132 | A1 | 7/2012 | Nishihara et al. |
| 2012/0194190 | A1 | 8/2012 | Goto et al. |
| 2012/0268130 | A1 * | 10/2012 | Fautz ................ G01R 33/5612 324/318 |
| 2013/0249549 | A1 * | 9/2013 | Pfeuffer ............ G01R 33/4833 324/309 |
| 2013/0253876 | A1 | 9/2013 | Pfeuffer et al. |
| 2013/0265053 | A1 | 10/2013 | Itagaki et al. |

FOREIGN PATENT DOCUMENTS

| | | |
|---|---|---|
| EP | 2378307 A1 | 10/2011 |
| JP | S61202286 A | 9/1986 |
| JP | 2003299633 A | 10/2003 |
| JP | 2005152655 A | 6/2005 |
| JP | 2007536970 A | 12/2007 |
| JP | 2010051803 A | 3/2010 |
| JP | 2010051804 A | 3/2010 |
| JP | 2013192941 A | 9/2013 |
| KR | 20010051717 A | 6/2001 |

OTHER PUBLICATIONS

W. Grissom et al., "Spatial Domain Method for the Design of RF Pulses in Multicoil Parallel Excitation," Magnetic Resonance in Medicine, vol. 56 pp. 620-629, 2006.

K. Setsompop et al., "Magnitude Least Squares Optimization for Parallel Radio Frequency Excitation Design Demonstrated at 7 Tesla With Eight Channels," Magnetic Resonance in Medicine, vol. 59, pp. 908-915, 2008.

M. Seeger et al., "Optimization of k-Space Trajectories for Compressed Sensing by Bayesian Experimental Design," Magnetic Resonance in Medicine, vol. 63, pp. 116-126, 2010.

Dr. D. Ritter, "PTX-Pulse Design Suite," Siemens Healthcare, MR Physics Group, pp. 1-67, 2011.

D. Yoon et al., "A Fast Parallel Excitation Pulse Design for Efficient Selection and Ordering of PE Locations With B0 Field Inhomogeneity," Proc. Intl. Soc. Magnetic Resonance in Medicine, vol. 19, p. 2902, 2011.

R. Schneider et al., "Evaluation of 2DRF Echo-Planar Pulse Designs for Parallel Transmission," Siemens Healthcare Erlangen Germany, Institute of Biomedical Engineering and Informatics TU Ilmenau Germany, p. 1928, May 8, 2012.

R. Schneider et al., "Novel 2DRF Optimization Framework for Spatially Selective RF Pulses Incorporating B1, B0 and Variable-Density Trajectory Design," Institute of Biomedical Engineering and Informatics TU Ilmenau Germany, p. 1884, May 8, 2012.

M. Jankiewicz et al., "Practical Considerations for the Design of Sparse-Spoke Pulses," Journal of Magnetic Resonance, vol. 203, pp. 294-304, 2010.

M. Deniz et al., "Specific Absorption Rate Benefits of Including Measured Electric Field Interactions in Parallel Excitation Pulse Design," Magnetic Resonance in Medicine, vol. 67, pp. 164-174, 2012.

Korean Office Action for Related Korean Application No. 10-2013-0029792 dated Jun. 10, 2015.

Chinese Office Action for Related Chinese Application No. 201310089252.1 dated Oct. 10, 2015, with English Translation.

* cited by examiner

FIG 8
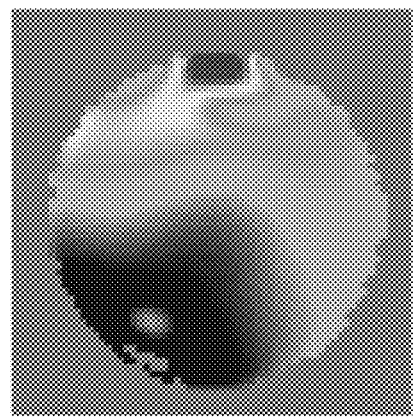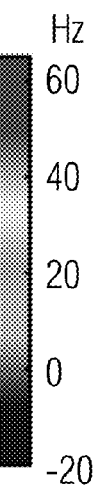
FIG 9
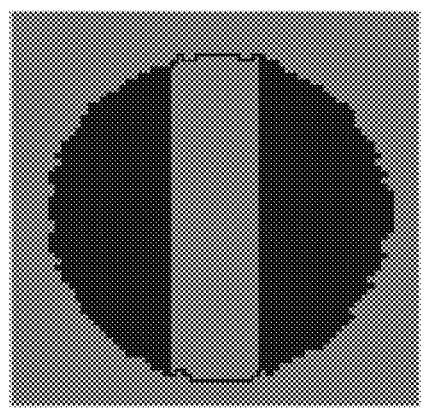
FIG 10
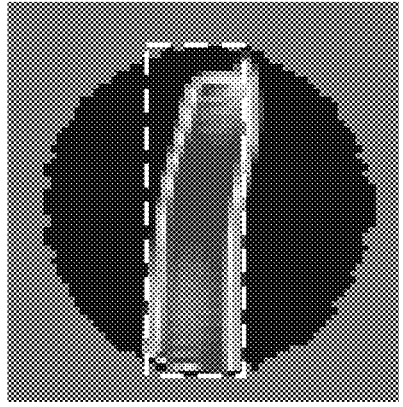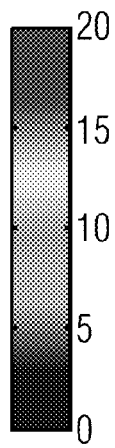

FIG 11
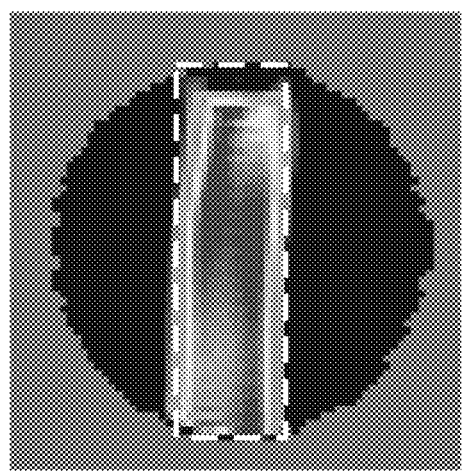 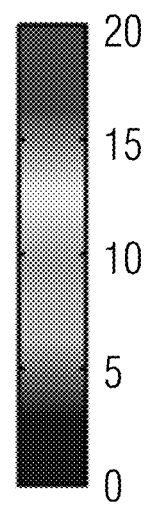
FIG 12
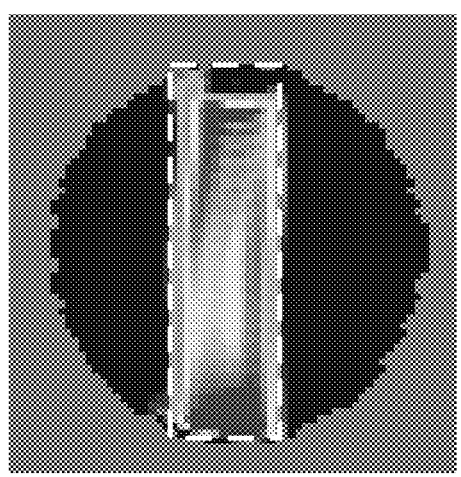 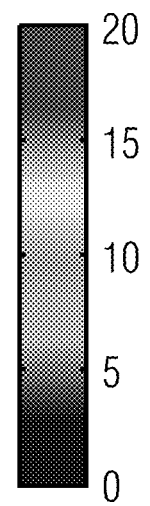

DETERMINATION OF A MAGNETIC RESONANCE SYSTEM ACTIVATION SEQUENCE

This application claims the benefit of DE 10 2012 204 401.9, filed on Mar. 20, 2012, and DE 10 2012 212 376.8, filed on Jul. 16, 2012, which are hereby incorporated by reference.

BACKGROUND

The present embodiments relate to a method and a control sequence determination device for the determination of a magnetic resonance system activation sequence.

In a magnetic resonance tomography system (e.g., magnetic resonance system), the body that is to be examined may be subjected to a relatively high main magnetic field (e.g., the $B_0$ field; 3 or 7 Tesla), with the aid of a main field magnetic system. In addition, a magnetic field gradient is applied with the aid of a gradient system. Using a high-frequency transmitter system, high-frequency excitation signals (HF signals) are emitted by suitable antenna devices, the intention of which is that the nuclear spins of specific atoms or molecules, excited to resonance by this high-frequency field, are tilted by a defined flip angle in relation to the magnetic field lines of the main magnetic field. This high-frequency excitation and, respectively, the resultant flip angle distribution are also designated hereinafter as nuclear magnetization or simply "magnetization". With the relaxation of the nuclear spin, high-frequency signals (e.g., magnetic resonance signals) are irradiated. The high-frequency signals are received by suitable reception antennae and then undergo further processing. From the raw data acquired in this way, the desired image data may be reconstructed. The transmission of the high-frequency signals (e.g., the $B_1$-field) for the nuclear spin magnetization takes place by a "whole body coil" arranged permanently in the device around the measuring area (e.g., patient tunnel). Reception of the magnetic resonance signals takes place in most cases with the aid of local coils that are positioned more densely on the body of the patient. Reception of magnetic resonance signals may also be carried out with the whole body coil, and/or the transmission of the HF signals may be carried out with the local coils.

For a specific measurement, an activation sequence with a high-frequency pulse sequence to be transmitted, and a gradient pulse sequence that is to be switched in co-ordination with this (e.g., with suitable gradient pulses in the layer selection direction, in the phase coding direction, and in the read-out direction, frequently in the z-direction, y-direction, and z-direction), and further control specifications are defined in a measurement protocol. This measurement protocol may be established in advance and be called up for a specific measurement (e.g., from a memory) and, if appropriate, may be changed on site by the operator. During the measurement, the control of the magnetic resonance system may be carried out fully automatically on the basis of this activation sequence, where the control device of the magnetic resonance system reads out the commands from the measurement protocol and processes the commands.

For the generation of the activation sequence, in, for example, an optimization process, the individual HF pulse sequences (e.g., the HF trajectories) are determined for the individual transmission channels over time as a function of a fixed "k-space trajectory" that may be specified by a measurement protocol or individually by an operator. The "transmission k-space trajectory" (e.g., a "trajectory") relates to the locations in the k-space that are moved to by the adjustment of the individual gradients at specific times. The k-space is the spatial frequency space, and the trajectory in the k-space describes by which route the k-space will be run through temporally when an HF pulse is transmitted, by appropriate switching of the gradient pulses. By adjusting the k-space trajectory, at which spatial frequencies specific HF energy quantities will be deposited may be determined.

For the generation of the activation sequences in this situation, account may additionally be taken in the optimization process of currently measured $B_1$-maps that, in each case, indicate the spatial $B_1$ field distribution for a specific antenna element, and a $B_0$ map that spatially resolves the off-resonances or represents the deviation of the $B_0$ field from the homogeneous $B_0$ field that is actually desired (e.g., the Larmor frequency that is actually being striven for). In addition, for the planning of the HF pulse sequence, the user may specify a target magnetization such as a desired flip angle distribution. With a suitable HF pulse optimization program, the suitable HF pulse sequence is calculated, such that the target magnetization is attained. This may involve the most homogeneous possible magnetization in the Field of View (FoV) that is to be examined, or, respectively, the Field of Excitation (FoE) that is to be excited.

With more recent methods, quite specific regions (e.g., two-dimensional) may be excited within a layer (e.g., a non-homogeneous target magnetization is deliberately striven for).

One possibility of determining a two-dimensional high-frequency pulse sequence (e.g., a "2DRF-Pulse") in the manner described heretofore is described in the article "Magnitude Least Square Optimization for Parallel Radio Frequency Excitation Design Demonstrated at 7 Tesla With Eight Channels" by K. Setsompop et al., Magn. Reson. Med. 59: 908 to 915, 2008. In this situation, the transversal target magnetization is represented in a linear matrix equation system from the spatial coil profiles and the multi-channel high-frequency pulse sequences, into which information is also introduced about the $B_0$ maps and $B_1$ maps present and the k-space trajectory used. This equation system is resolved numerically for a specific predetermined target magnetization in order to obtain the appropriate high-frequency pulse sequence.

In relation to the trajectories that may be used, however, with constant gradients that are used for a simple layer-selective excitation, such one-dimensional, two-dimensional, or multi-dimensional k-space trajectories for selective excitation exhibit a substantially greater complexity. Due to this greater complexity, there is also an increased risk of artifact formation in the images (e.g., because such pulses may be substantially longer). Complicated k-space trajectories of this type may therefore be determined within the framework of an optimization process automatically, taking account of specific stipulations (e.g., jointly with the HF pulse sequence).

SUMMARY AND DESCRIPTION

The present embodiments may obviate one or more of the drawbacks or limitations in the related art. For example, a method is provided for the determination of a magnetic resonance system activation sequence and a corresponding control sequence determination device that are capable of carrying out very rapid and robust calculations of optimized k-space trajectories.

In one embodiment of the method, a current $B_0$ map is determined, as explained heretofore. Optionally, a desired target magnetization may be determined. A k-space trajectory type is determined, for example, by adoption from a measurement protocol or from a user interface, into which an operator enters the k-space trajectory type. With such a k-space trajectory type, the type of the k-space trajectory is to be indicated (e.g., whether this involves a spiral trajectory, a straight-line (rectilinear) trajectory for an echo planar imaging (EPI) sequence, or radial trajectories with concentrically rotated spokes). This only indicates the basic type. An error density in the k-space is calculated on the basis of the current $B_0$ map and, optionally, on the basis of the target magnetization using an analytical function or error metric. This analytical function defines the error density in the k-space as a function of the current $B_0$ map and optionally of the target magnetization. The term "error metric" may be a quantitative, functional relationship between the k-space error density and the $B_0$ map or, respectively, the target magnetization. In other words, this error metric contains a given analytical connection between the $B_0$ map or, respectively, the target magnetization and the k-space error density being sought.

Taking this error density into account, by an analytical calculation, for example, a k-space trajectory of the specified k-space trajectory type may be determined. In this situation, the k-space trajectory may, for example, be calculated such that the trajectory density in the possible regions in which the error in the k-space is particularly pronounced (e.g., "error hot-spots") is minimized (e.g., the locations in the k-space with the strongest $B_0$-inhomogenity effects are avoided). The determination of the k-space trajectory may be carried out in this situation, as is explained in greater detail hereinafter, such that in the first instance, a k-space trajectory density is calculated on the basis of the error density, and then the determination of the trajectory is defined based on the density. The term "k-space trajectory density" may be how closely different trajectory traverses lie next to one another in the k-space (e.g., with an EPI trajectory, how closely together two adjacent parallel lines lie to one another; with a spiral trajectory, how closely the trajectory runs past from one spiral to the next spiral; or with a radial trajectory, how narrow the angle is between two spokes).

The high-frequency pulse sequence for the k-space trajectory is determined in an HF pulse optimization process (e.g., on the basis of the specified target magnetization or on the basis of the specified $B_1$ maps). This determination of the high-frequency pulse sequence may be carried out as with the conventional methods, with which the k-space trajectory is definitively specified right at the beginning (e.g., with uniform trajectory density distribution).

The error density is calculated in the first instance, and therefore, a deterministic metric, on the basis of which the k-space trajectory may be calculated or determined, is provided. Without knowledge of such an error density, an attempt may not be made (e.g., simply in an iterative process) to determine an optimized k-space trajectory. The risk may pertain to passing into a local minimum during the iterative process, and therefore obtaining a sub-optimum trajectory. Instead, on the basis of the input data, the error density that actually exists is firstly determined, such that the k-space trajectory may be plotted such that, in the k-space, at all the locations where the error is particularly great, sampling is carried out less often (e.g., the density of the sampling points is selected as smaller), while by contrast, at other locations at which the error is low, a higher sampling density is attained.

One embodiment of the method is therefore particularly rapid in calculation, as well as being particularly robust. This also leads overall to a speed advantage and to better image quality of the measurement as a whole.

A control sequence determination device includes an input interface arrangement for the determination of a current $B_0$ map, for the acquisition of a specified k-space trajectory type, and, as appropriate, for the acquisition of a specified target magnetization. Such an interface arrangement may include several different interfaces that in each case acquires the data concerned, or one combined interface that is capable of taking over several data types. The term "acquisition of data" may also be the taking over of data from other components of the magnetic resonance system (e.g., from a user interface or from a memory storage unit with a databank) or the taking over of data from a measuring device or reconstruction device of the magnetic resonance system. The input interface arrangement may accordingly be, for example, a user interface for the manual input of the k-space trajectory type and a target magnetization and, for example, a graphic user interface. In this situation, however, this may also be an interface for selecting and taking over data from a data memory store arranged inside the control sequence determination device or via a network connected to the control sequence determination device (e.g., if appropriate, also making use of the user interface).

The control sequence determination device also includes an error density calculation unit for calculating an error density in the k-space on the basis of the current $B_0$ map and optionally on the basis of the target magnetization using the analytical function already referred to. The control sequence determination device also includes a trajectory determination unit for the determination of a k-space trajectory of the specified k-space gradient type, taking account of this error density in the k-space. An HF pulse optimization unit is used for the determination of the high-frequency pulse sequence for the k-space trajectory. In addition to this, the control sequence determination device may exhibit a suitable control sequence output interface in order to transfer the control sequence to other control units of the magnetic resonance tomography system. The control sequence output interface may, for example, be an interface that transfers the control sequence to a magnetic resonance control unit in order thereby to control the measurement directly. The control sequence output interface may also be an interface that sends the data via a network and/or deposits the data in a memory for later use.

With a method for the operation of a magnetic resonance system, according to the method described heretofore, an activation sequence is determined, and the magnetic resonance system is operated making use of this activation sequence. Accordingly, a magnetic resonance system of the type described heretofore exhibits a control sequence determination device of the type described heretofore.

Substantial parts of the control sequence determination device may be provided in the form of software components. This relates, for example, to the error density calculation unit, the trajectory determination unit, and the HF-pulse optimization unit. The interfaces may be at least partially provided in the form of software, and may recourse to hardware interfaces of an available computer.

A computer program that may be loaded directly into a memory of a control sequence determination device, with program code sections, in order to carry out all the acts of the method when the program is run in the control sequence determination device is also provided. Such a software-type realization has the advantage that previous devices that are used for the determination of control sequences (e.g., suitable computers in computer centers of the magnetic resonance system manufacturers) may be modified by the implementation of the program in a suitable manner in order to determine optimized control sequences rapidly and robustly.

The description of one category may also, by analogy, be further applied to the description of another claims category.

The error density may be calculated only on the basis of a $B_0$ map, such that account may be taken of the error density of the frequency deviations (e.g., the off-resonances) caused by the inhomogeneity of the $B_0$ field. The target magnetization serves for the purpose, with the k-space trajectory found, of determining an appropriate high-frequency pulse sequence, such that the target magnetization is attained. In a variant of the method, however, in the calculation of the error density, as well as the $B_0$ map, account may also be taken of the target magnetization as a further component.

In one embodiment, on the basis of the current $B_0$ map, a phase error map may be determined, taking account, for example, of a roughly calculated length of the k-space trajectory. This phase error map is a possibility of an off-resonance error metric that indicates the possible error hot-spots in the k-space on the basis of the off-resonances. The error density may be calculated on the basis of this phase error map.

The high-frequency pulses are transmitted over only one transmission channel, and the high-frequency pulses are fed into the whole-body coil in a suitable manner. For example, the high-frequency signal may be separated, and the part signals, correspondingly spatially offset by 90° to one another, with amplitude and phase displacement, may be fed into a whole-body coil set up in the form of a birdcage antenna, such that a circular (e.g., phase only) or elliptical (e.g., amplitude and phase) polarized $B_1$ field is transmitted (e.g., a homogeneous polarized $B_1$ field).

With more recent magnetic resonance systems, the individual transmission channels (e.g., the individual rods of a cage antenna) may be occupied by individual HF signals adapted to the image reproduction. To do this, a multi-channel pulse sequence that includes several individual high-frequency pulse sequences that may be transmitted in parallel via the different independent high-frequency transmission channels is transmitted. Such a multi-channel pulse sequence, due to the parallel transmission of the individual pulses (e.g., "pTX pulse") may be used as an excitation, refocusing, and/or inversion pulse. A method for the development of such multi-channel pulse sequences in parallel excitation methods is described, for example, in W. Grissom et al.: "Spatial Domain Method for the Design of RF Pulses in Multicoil Parallel Excitation", Mag. Res. Med. 56, 620-629, 2006.

The method offers particular advantages within the framework of such pTX methods, such that the method is, for example, also used in such a way that the magnetic resonance system activation sequence produced includes a multi-channel pulse sequence with several individual HF pulse sequences to be transmitted in parallel by the magnetic resonance tomography system over different independent high-frequency transmission channels. For example, the determination of the multi-channel pulse sequence is also effected on the basis of $B_1$ maps that in each case indicates the distribution of the $B_1$ field for the individual transmission channels.

The method may also be used in conjunction with traditional methods and systems with one transmission channel, where, if applicable, the current $B_1$ map is not measured separately but is provided by assumption or modeling, respectively.

Advantageously, the method for determining the k-space trajectory may also be combined with other methods.

In one embodiment, the k-space trajectory is determined such that the k-space is sub-sampled at the activation of the magnetic resonance system with the aid of the magnetic resonance system activation sequence that has been produced. This is advantageous if a pTX system is being used, since in that case, by adroit sub-sampling and simultaneous use of the parallel transmission system, an acceleration of the excitation and therefore of the measurement may be provided.

For example, in one embodiment, the k-space may be sub-sampled region by region in a regular pattern (e.g., with a TX-SENSE method (e.g., sensitivity encoding)). In this situation, the transmission k-space is uniformly sub-sampled by a specific factor (e.g., 2, 3, 4 times), and in this situation, is transmitted in parallel with a corresponding number of high-frequency channels. With this method, for example, the use of information from the $B_1$ maps is advantageous, and, for example, subject to the condition that the $B_1$ maps of the different channels are at least in part orthogonal.

In another embodiment of the method, the sub-sampling of the k-space takes place at least region by region in an irregular pattern and/or at random, which is possible, for example, in conjunction with "compressed sensing" methods.

In order to carry out the most widely differing methods, the determination of the k-space trajectory takes place, for example, also on the basis of at least further examination-specific or, respectively, examination type-specific parameters and/or on the basis of device-specific or device type-specific parameters. For example, these include at least one of the following device-specific parameters.

The at least one device-specific parameter may include the number of transmission channels (e.g., if it is intended that sub-sampling is to take place within the framework of the TX-SENSE method).

In addition, the determination of the k-space trajectory may be effected on the basis of the maximum gradient amplitude attainable within the magnetic resonance tomography system and/or, for example, permissible on the basis of safety limits.

Likewise, the determination of the k-space trajectory may be effected by taking account of the maximum attainable and/or permissible gradient slew rate (e.g., the rise or fall rate of a gradient pulse, which may likewise be a burden for a patient).

In practice, the $B_0$ field distribution may change dynamically with time (e.g., due to instability of the device and/or movements and physiology such as respiration and heart beat of the patient/test subject). As a result of this, typical instability problems may arise in the imaging and artifacts (e.g., with functional imaging (fMRI)), as well as with perfusion and diffusion imaging. Accordingly, during a measurement (e.g., within the framework of a measurement session in which several images are usually prepared such as when several measurement sequences are run off), for example, an updated $B_0$ map is acquired anew, and, based on the updated $B_0$ map, a new k-space trajectory is determined for at least one magnetic resonance system activation sequence used subsequently in the measurement. This may be carried out, for example, repeatedly at regular time intervals or at irregular intervals. Likewise, a new event-activated measurement may be carried out, for example, if this is detected by MR signals (internally) or by external sensors (e.g., movement sensors, magnetic field sensors).

The method may be used with any desired trajectory types (e.g., with EPI trajectories or spiral geometries) but also with spoke position geometries, radial geometries, or free-form geometries.

For example, the calculation of the high-frequency pulse sequence within the framework of the HF pulse optimization process takes place for a lower target magnetization. The multi-channel pulse sequence determined in this situation is then scaled up to a final target magnetization and, if appropriate, is then subsequently corrected once more. For this procedure, use is made of the fact that for small magnetizations (e.g., for small flip angles (in the "low-flip range") such as between 0 and 5°), the magnetization behavior is still linear. Accordingly, in this range, a calculation with an optimization process is substantially easier and faster. Once the optimum multi-channel pulse sequence has been found for this range, then, in a subsequent act, scaling-up may be provided. If, for example, the calculation in the low-flip range is carried out for a flip angle of maximum $\alpha=5°$, and it is intended that the actual magnetization is to be carried out with a flip angle $\alpha$ of maximum 90°, then, according to the ratio of the flip angles, the amplitude values of the HF pulses may be multiplied by a factor of 18. The errors that may arise in this situation may be determined and corrected within the framework of a simulation.

In view of the fact that, within the framework of the method, as well as the optimization according to the k-space trajectory, a determination of an optimum high-frequency pulse sequence may be carried out by conventional HF pulse optimization methods. In this situation, other parameters may be optimized (e.g., with regard to a physical HF loading value of the object under examination). For example, the parameters used for the HF pulse optimization may be varied later within a Tikhonov regularization, or other system parameters such as, for example, the maximum gradient intensity or the flank time may be varied within the framework of the optimization in order thereby also to achieve optimized results with respect to the SAR or SED values, respectively.

BRIEF DESCRIPTION OF THE DRAWINGS

FIG. 8 shows an exemplary $B_0$ map of a phantom sphere;

FIG. 9 shows an exemplary target magnetization (excitation profile) for the phantom sphere according to FIG. 8;

FIG. 10 shows exemplary magnetization attained in the phantom sphere according to FIG. 8, with the excitation profile according to FIG. 9, with a conventional EPI sequence;

FIG. 11 shows exemplary magnetization attained in the phantom sphere according to FIG. 8, with the excitation profile according to FIG. 9, with an EPI sequence optimized according to one embodiment, with a transmission channel; and FIG. 12 shows magnetization attained in the phantom sphere according to FIG. 8, with the excitation profile according to FIG. 9, with an EPI sequence optimized according to one embodiment, with two transmission channels.

DETAILED DESCRIPTION

Figure 1:
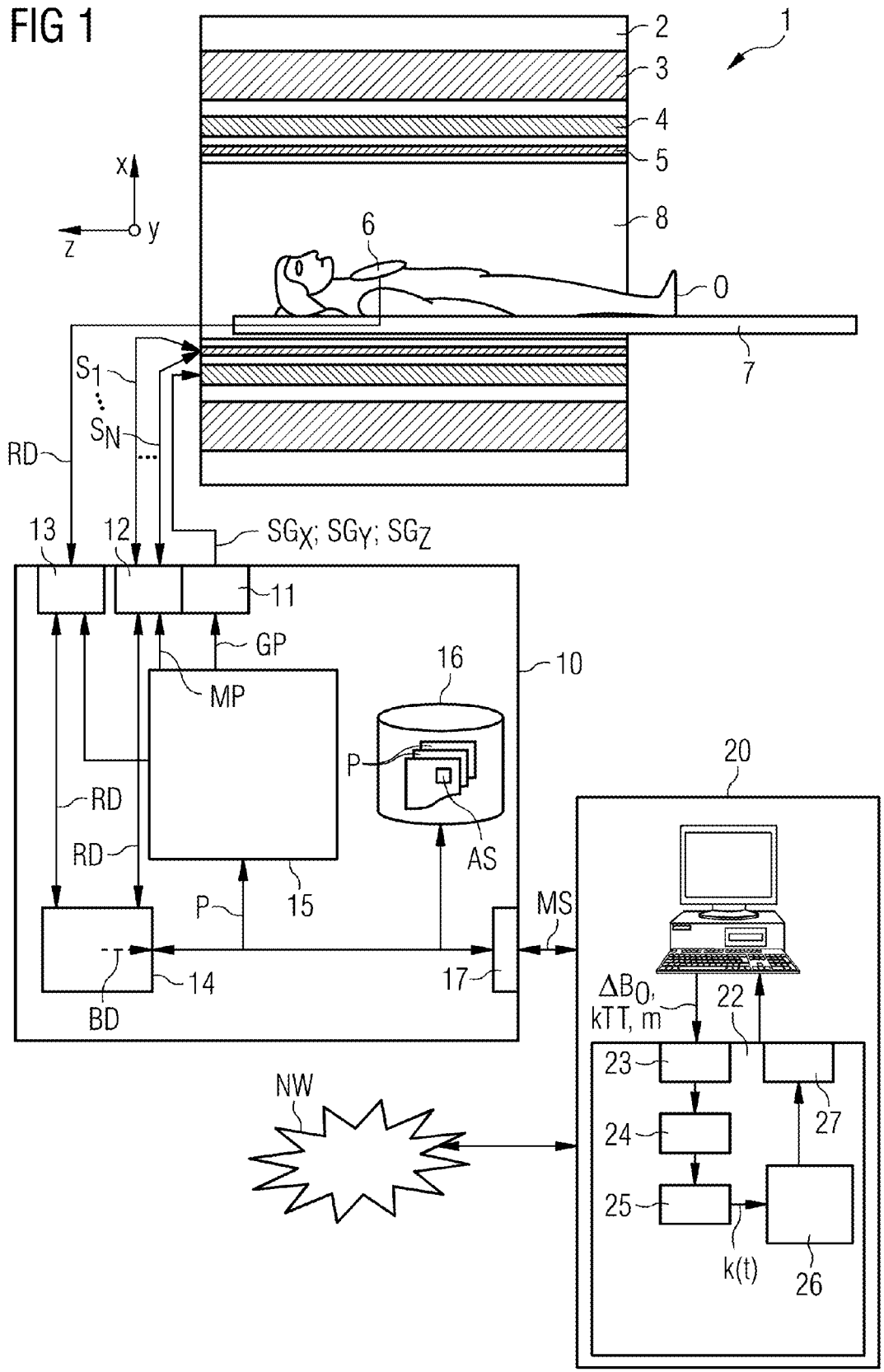
FIG. 1 shows a diagrammatic representation of an exemplary embodiment of a magnetic resonance system.

FIG. 1 shows, in rough diagrammatical form, one embodiment of a magnetic resonance system 1. The magnetic resonance system 1 includes an actual magnetic resonance scanner 2 with an examination space 8 or patient tunnel disposed in the actual magnetic resonance scanner 2. A couch 7 may be moved into the patient tunnel 8, such that an object O to be examined (e.g., a patient/test subject) lying on the couch 7 may be positioned during an examination in a specific position inside the magnetic resonance scanner 2 relative to the magnet system and high-frequency system arranged inside. The object O may also be moved during a measurement between different positions.

Major components of the magnetic resonance scanner 2 are a basic field magnet 3, a gradient system 4 with magnetic field gradient coils in order to apply magnetic field gradients, as desired, in the x-, y- and z-directions, and a whole-body high-frequency coil 5. The reception of the magnetic resonance signals induced in the examination object O may be effected via the whole body coil 5, with which the high-frequency signals for inducing the magnetic resonance signals are also transmitted. These signals, however, may be received by local coils 6 located, for example, on or under the object O under examination. All these components are, in principle, known to the person skilled in the art and are therefore only represented in rough diagrammatic form in FIG. 1.

The whole body high-frequency coil 5 is arranged, for example, in the form of a birdcage antenna and exhibits a number N of individual antenna rods that run parallel to the patient tunnel 8 and are arranged distributed uniformly on a circumference around patient tunnel 8. On an end side, the individual antenna rods are in each case connected capacitively in a ring fashion. The individual antenna rods may be controlled, for example, as individual transmission channels $S_1, \ldots, S_N$ separately by a control device 10 (e.g., the magnetic resonance tomography system is a pTX-capable system). One embodiment of the method may also be used to advantage on traditional magnetic resonance tomography devices with only one transmission channel. Due to the fact that the method offers particular advantages with pTX sequences, such an example is provided as the basis hereinafter without restricting the general application unless indicated otherwise.

The control device 10 may be a control computer that may also include a plurality of individual computers (e.g., spatially separated and connected to one another by suitable cables or the like). Using a terminal interface 17, the control device 10 is connected to a terminal 20, by which a user may activate the entire system 1. The terminal 20 is equipped, for example, as a computer with keyboard, one or more display screens, and further input devices such as, for example, a mouse or the like. The user is provided with a graphic user interface.

The control device 10 exhibits, among other elements, a gradient control unit 11 that may include several part components. Using the gradient control unit 11, the individual gradient coils are provided with control signals $SG_x$, $SG_y$, $SG_z$. These are gradient pulses that, during a measurement, are set to precisely predetermined temporal positions and with a precisely predetermined temporal sequence.

The control device 10 also includes a high-frequency transmitter/receiver unit 12. The HF transmitter/receiver unit 12 also includes several part components in order to emit high-frequency pulses in each case separately and parallel onto the individual transmission channels $S_1, \ldots S_N$ (e.g., onto the individually controllable antenna rods of the body coil). Magnetic resonance signals may also be received by the transmitter/receiver unit 12. In one embodiment, this is done with the aid of the local coils 6. The raw data RD received by the local coils 6 is read out and processed by an HF receiver unit 13. The magnetic resonance signals received by the HF receiver unit 13 or by the whole body coil using the HF transmitter/receiver unit 12 are forwarded as raw data RD to a reconstruction unit 14 that reconstructs image data BD from the raw data RD and deposits the image data BD in a memory 16 and/or transfers the image data BD via the interface 17 to the terminal 20, such that the user may observe the image data BD. The image data BD may also be stored and/or displayed and evaluated at other locations via a network NW. Inasmuch as the local coils exhibit a suitable switching unit, the local coils may also be connected to an HF transmitter/receiver unit in order for the local coils also to be used for transmitting.

The gradient control unit 11, the HF transmitter/receiver unit 12, and the receiver unit 13 for the local coils 6 are activated in a coordinated manner by a measurement control unit 15 in each case. This provides, by appropriate commands, that a desired gradient pulse sequence GP is transmitted by suitable gradient control signals $SG_x$, $SG_y$, $SG_z$, and activates, in parallel, the HF transmitter/receiver unit 12, such that a multi-channel pulse sequence MP is transmitted (e.g., that on the individual transmission channels $S_1, \ldots S_N$, in parallel, the appropriate high-frequency pulses are emitted onto the individual transmitter rods of the whole body coil 5). In addition to this, the magnetic resonance signals at the local coils 6 are read out and further processed by the HF receiver unit 13 at the appropriate time, or possible signals at the whole-body coil 5 are read out by the HF transmitter/receiver unit 12. The measurement control unit 15 issues the corresponding signals (e.g., the multi-channel pulse sequence MP) to the high-frequency transmitter/receiver unit 12 and the gradient pulse sequence GP to the gradient control unit 11 in accordance with a predetermined control protocol P. In this control protocol P, all the control data to be set and adjusted during a measurement is deposited.

In one embodiment, a plurality of control protocols P for different measurements are deposited in a memory 16. The control protocols P may be selected and, if necessary, varied by the user via the terminal 20 in order to have available an appropriate control protocol P for the currently desired measurement, with which the measurement control unit 15 may work. Apart from this, the user may also call up, via a network NW, control protocols (e.g., from a manufacturer of the magnetic resonance system) and modify and use the control protocols if the need arises.

The basic sequence of such a magnetic resonance measurement and the components referred to for activation are known to the person skilled in the art, however, and are therefore not discussed here in detail any further. Incidentally such a magnetic resonance scanner 2 and the corresponding control device may also exhibit a plurality of further components that are likewise not explained here in detail. The magnetic resonance scanner 2 may also be structured differently (e.g., with a patient space open to the side). The high-frequency whole-body coil does not have to be structured as a birdcage antenna.

Represented in diagrammatic form in FIG. 1, in addition, is one embodiment of a control sequence determination device 22. The control sequence determination device 22 determines a magnetic resonance system activation sequence AS. The magnetic resonance system activation sequence AS includes, among other elements, for a specific measurement a pulse sequence with a gradient pulse sequence GP in order to run through a specific trajectory in the k-space. The magnetic resonance system activation sequence AS also includes a high-frequency pulse sequence coordinated with this (e.g., a multi-channel pulse sequence MP for the activation of the individual transmission channels $S_1, \ldots, S_N$). The magnetic resonance system activation sequence AS is produced as a part of the measurement protocol P.

The control sequence determination device 22 is represented, for example, as a part of the terminal 20 and may be realized in the form of software components on the computer of the terminal 21. The control sequence determination facility 22 may also be a part of the control device 10 itself, or be realized on a separate computer system. The finished and ready activation sequences AS are, if appropriate, also within the framework of a complete control protocol P, also transmitted via a network NW to the magnetic resonance system 1. If the control sequence determination device 22 itself is part of the control device 10, or if the control sequence determination device 22 is connected via a fast connection to the terminal 20 or to a suitable fast computer with adequate computing capacity, a new updated and current control sequence may be determined on the basis of current starting conditions such as, for example, an updated $B_0$ map, even during a measurement session (e.g., in the course of the examination of a patient).

The control sequence determination device 22 exhibits an input interface 23. Via the input interface 23, the control sequence determination device 22 receives a target magnetization m that specifies how the flip angle distribution is to be with the desired measurement, specifies a k-space trajectory type kTT, a $B_0$ map $\Delta B_0$ and, as appropriate, also other input parameters that are explained below in greater detail in connection with FIG. 2.

The data obtained in this way is forwarded to the error density calculation unit 24, which, in the manner explained below, determines an error density in the k-space. A following trajectory determination unit 23 then determines, on the basis of this error density in the k-space, an optimum k-space trajectory. In an HF pulse optimization unit 26, an optimum high-frequency pulse sequence MP for this trajectory may then be determined.

This data is reproduced via a control sequence output interface 27 and may be transferred, for example, within the framework of a control protocol P, in which further specifications are provided for the activation of the magnetic resonance system 1 (e.g., parameters for the reconstruction of the images from the raw data) to the control device 10. If the activation sequence AS is to be updated in the course of a measurement session, the activation sequence AS may also be deposited in the control protocol P, such that, at suitable moments in time, a new activation sequence AS is automatically determined by the control device 10 or, for example, requested by the terminal 20 or by another computer.

Figure 2:
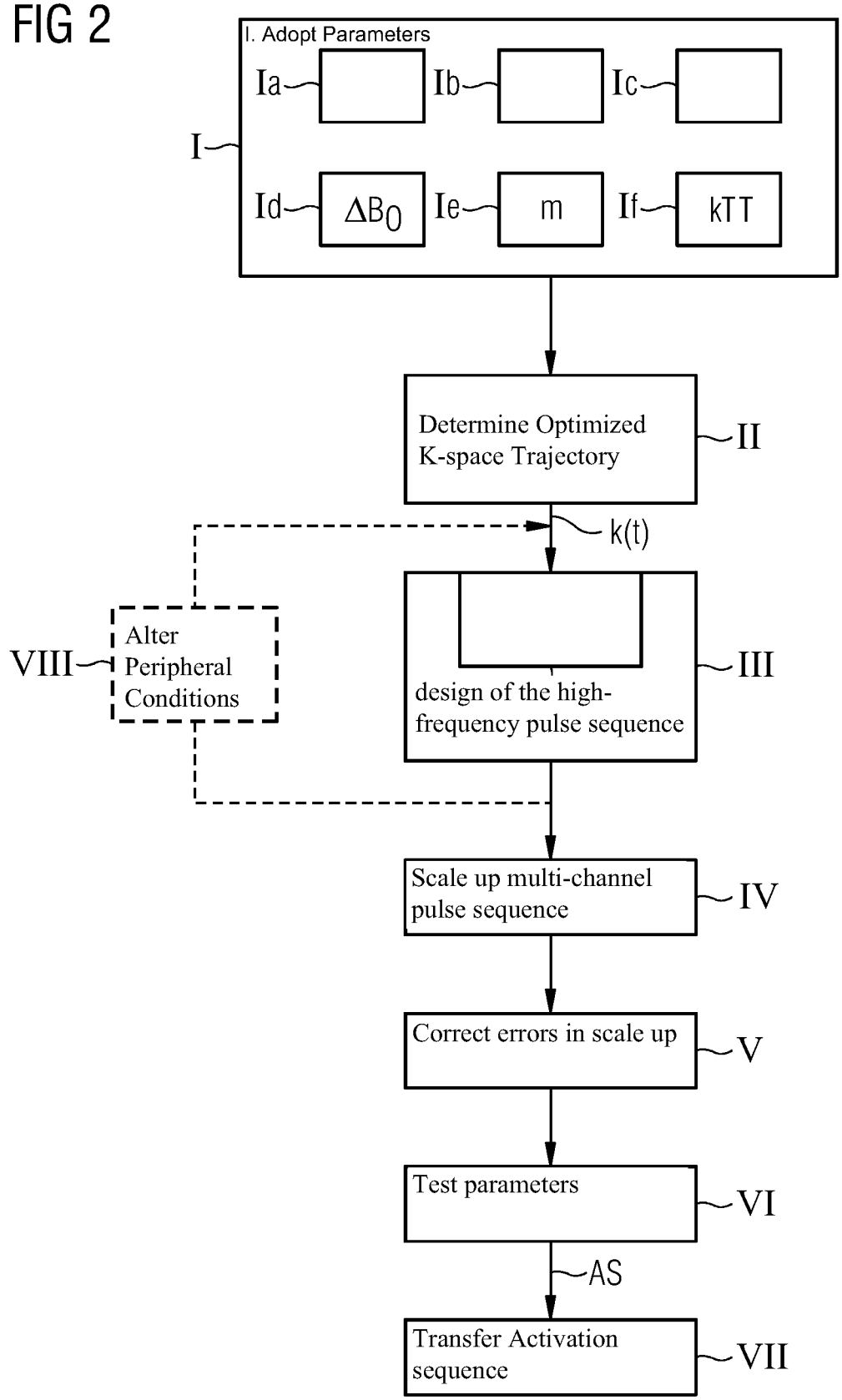
FIG. 2 shows a flow chart for a possible sequence according to an exemplary embodiment of the method for the determination of an activation sequence.

One embodiment of the method for the determination of a magnetic resonance system activation sequence AS is explained hereinafter on the basis of the diagram according to FIG. 2 via a simple example.

In act I, different parameters used within the process are specified or adopted. For example, in act Ia, system-specific parameters are adopted (e.g., the number of transmission channels, a maximum slew rate, a maximum gradient amplitude). In act Ib, various different examination-specific parameters are adopted (e.g., the positioning of the layers to be examined). In act Ic, the $B_1$-maps for the individual transmission channels are adopted. In act Id, a currently measured $B_0$-map $\Delta B_0$ that, as explained heretofore, reflects the off-resonances caused by the inhomogeneities of the basic magnetic field may be specified as a function of the location. These inhomogeneities are also caused, for example, by the patient's body and may change, for example, with the patient movements. In act Ie, a desired target magnetization m is specified. In act If, a k-space trajectory type kTT is specified (e.g., whether this is a straight-line trajectory, a spiral trajectory, radial trajectory). This may be carried out by the control protocol selected, since the trajectory frequently depends on the type of the measurement. Apart from act If, in which, with conventional methods, an exact k-space trajectory may be specified, and not only the trajectory type, the other inputs or data adoptions, respectively, may be carried out as with other methods. The sequence of these method acts may be chosen.

In act II, the optimized k-space trajectory k(t) is determined. This method act is explained again in greater detail below in connection with FIG. 3

In act III, the design of the high-frequency pulse sequence is automatically carried out (e.g., the design of a multi-channel pulse sequence). In this situation, the individual HF pulse sequences are developed for the different transmission channels. In other words, which HF pulse form is to be transmitted on which channel is calculated precisely. This is carried out first for a "low-flip range", with flip angles below 5°, since in this range the magnetization behavior still runs linear. In this case, an iterative optimization method is used, since the iterative optimization method may be well-suited. In specific terms, the conjugate-gradient method (CG method, from the English conjugate gradients, or also the method of conjugate gradients) may be used. However, other optimization methods may be used, even if not iterative.

This may be carried out with any desired methods. With many of the methods known heretofore, in this situation, the optimization method is carried out such that, for example, the quadratic mean deviation (least mean square) between the target magnetization and the actual magnetization is minimized. In other words, the following solution is sought:

$$\min(\|m_{ist}-m\|^2) \qquad (1)$$

In equation (1), m is the target magnetization, and $m_{ist}=A \cdot b(t)$, the (theoretical) actual magnetization attained by an HF pulse sequence b(t). A is the design matrix including a system of linear complex equations into which the spatial coil profiles and the $B_0$ maps and $B_1$-maps present are entered, as well as the k-space trajectory used. This design matrix is described, for example, in W. Grissom et al.: "Spatial Domain Method for the Design of RF Pulses in Multicoil Parallel Excitation", Mag. Res. Med. 56, 620-629, 2006. b(t) is a vector that includes, for example, the N functions $b_c(t)$ (one function for each transmission channel c=1 to N). This equation is set up, for example, in act Ma. If the solution to equation (1) is found, as a result, a function of the amplitude is present, depending on the time, for all the transmission channels available. Both the setting up of this equation as well as of various different solution possibilities are known to the person skilled in the art and are not explained here in detail. As an option, an optimized solution may also be attained by making use of an iterative method, for example, in that, in act VIII, peripheral conditions that are to be respected in the solving of the equation are altered in order to achieve an additional optimization of the high-frequency loading for the patient.

A multi-channel pulse sequence derived for the low-flip range, and a k-space trajectory are available at the end of the optimization act III. The multi-channel pulse sequence may be scaled up in act IV in order to attain the target magnetization actually desired, which may not lie in a flip angle range of 5° but goes up as far as a 90° flip angle. This is done simply by multiplication of the amplitudes of the individual pulses by the desired scaling factor.

In act V, the error that may occur during the scaling-up is corrected by a partial Bloch simulation. Such a partial Bloch simulation is carried out at individual isolated points in time within the pulse sequence. In this situation, by using the Bloch equations, the data for the respective point in time, for which the check is intended to take place, is tested in a simulator by using the Bloch equations. In this way, the magnetization achieved is calculated. In one embodiment, deviations from the specifications of the target magnetization may be detected, and appropriate smaller corrections may be carried out by changing the high-frequency pulse sequences.

In act VI, a test of all the parameters found takes place using a temporally-complete Bloch simulation. In this, a test is carried out as to whether the magnetization that is achieved with the parameters does in fact correspond to the target magnetization.

In act VII, the activation sequence AS is transferred for intermediate storage or immediate implementation.

Figure 3:
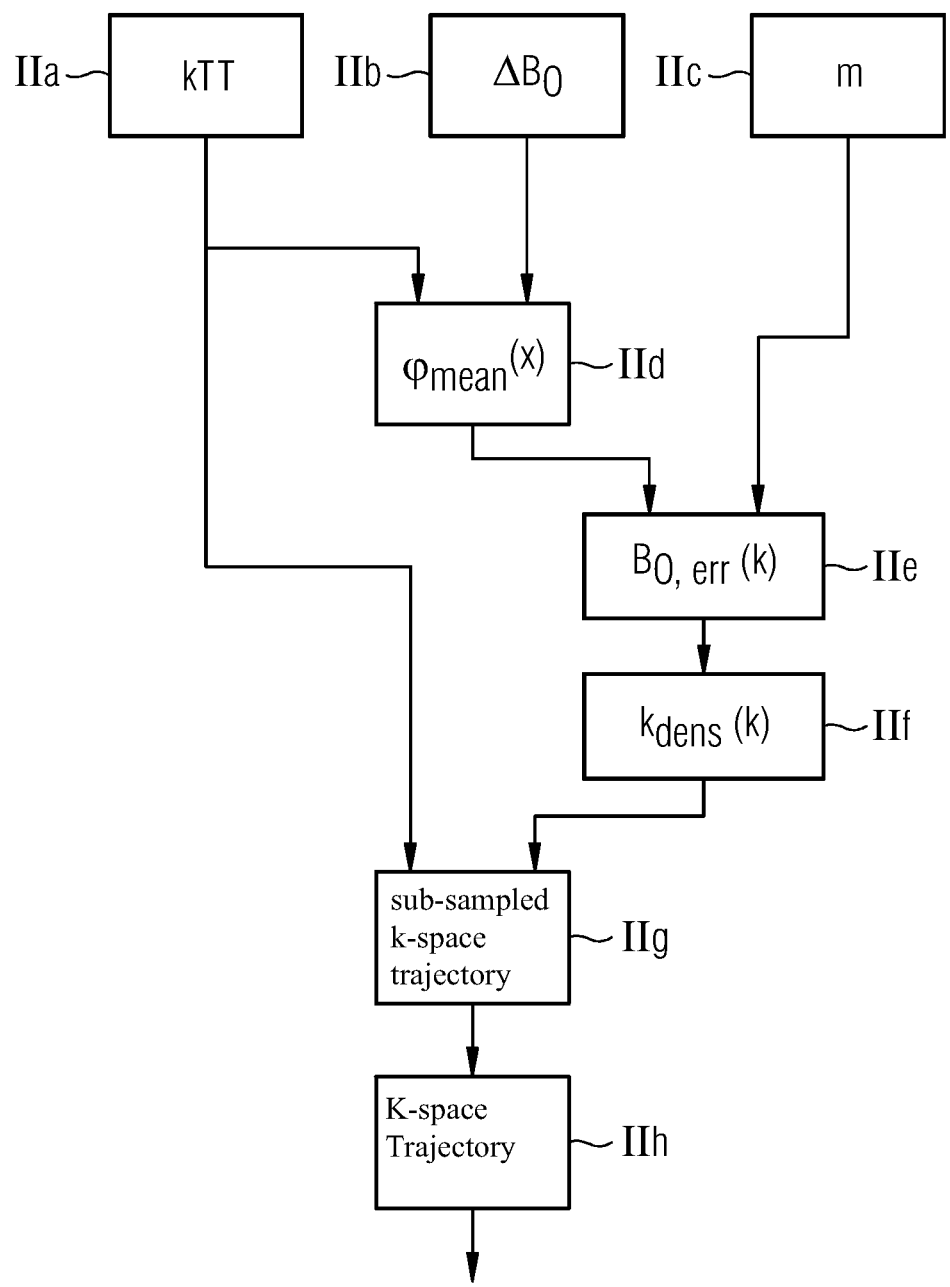
FIG. 3 shows a flow chart for a possible sequence according to an exemplary embodiment of the method for the determination of a k-space trajectory within the framework of the method according to FIG. 2.

In FIG. 3, act II, in which the k-space trajectory k(t) is determined, is represented in greater detail in the form of several part acts.

In act IIa, the adoption of a k-space trajectory type kTT, which was acquired in act III in FIG. 2, is shown again. Act IIb represents the adoption of a current $B_0$ map $\Delta B_0$ from act Id, and act IIc represents the adoption of the target magnetization m from act Ie in FIG. 2.

With the method represented in FIG. 3, in act IId, initially on the basis of the $B_0$ map $\Delta B_0$ and taking account of an estimated temporal trajectory length $T_{Puls}$ of a trajectory of the selected k-space trajectory type kTT, a phase error map $\phi_{mean}(x)$ (e.g., a temporally-determined phase error as a function of the respective location x) is calculated in accordance with:

$$\varphi_{mean}(x) = \frac{1}{T_{puls}} \sum_{t}^{T_{puls}} e^{i \cdot 2\pi \cdot \Delta B_0(x) \cdot t} \qquad (2)$$

Act IId takes place in a similar manner as acts IIa, IIb and IIc, still in the image space or location space. In act IIe, based on the target magnetization, the error density $B_{0,err}(k)$ in the k-space is calculated.

$$B_{0,err}(k) = \Phi_{error}(k) \cdot FT(m(x) - m_{mean}) \qquad (3)$$

where $$\Phi_{err}(k) = FT(\phi_{mean}(x)) \qquad (4)$$

is the phase error density $\Phi_{err}(k)$ in the k-space, which is produced by the Fourier transformation (FT) of the phase error ($\phi_{Mean}(x)$) determined according to equation (2) in the location space. The second term is the Fourier-transformed result of the deviation of the target magnetization at a location x from the mean magnetization value $m_{mean}$.

The equations (2) and (3) provide an example of the calculation of the error density $B_{0,err}(k)$ in the k-space. Another suitable analytical function $$B_{0,err}(k) = f(B_0(x), m(x)) \qquad (5)$$

may also be used.

By way of example, equation (2) may be varied, and, instead of the time-averaged phase error, a maximum phase error is calculated as a function of the respective location x.

On the basis of equation (3), a special case may already be detected. For example, the target magnetization for the calculation in equation (3) may be set to 1 for all locations x (e.g., the target magnetization is not taken into account). In this case, the equation (3) is reduced to $$B_{0,err}(k) = \Phi_{error}(k) \qquad (3a)$$

In other words, the later calculation of the optimum trajectory is carried out only on the basis of the phase error.

In act IIf, based on the error density, and in accordance with $$k_{dens}(k) = \frac{1}{(B_{0,err}(k) \cdot r)} \qquad (6)$$

the k-space density $k_{dens}(k)$ may be determined. The k-space density $k_{dens}(k)$ is a measure of how dense the k-space trajectories are at a location k in the k-space. In equation 7, r is a reduction factor, by which weighting is applied as to how intensely, in the final analysis, the error density affects the trajectory.

In order to provide that only large error densities take effect in the trajectory, and that the trajectory still remains relatively smooth, the error density may initially be "filtered" by a threshold value.

$$B_{0,err\_thr}(k) = B_{0,err}(k) > thr \qquad (7)$$

In this case, the k-space density $k_{dens}(k)$ is calculated according to $$k_{dens}(k) = \frac{1}{(B_{0,err\_thr}(k) \cdot r)} \qquad (8)$$

The calculation of the k-space density $k_{dens}(k)$ does not have to take place two-dimensionally (e.g., with a two-dimensional k-space in the x- and y-direction, with the aid of the method, only the densities of the trajectories in one direction such as the y-direction may be determined). The method may be applied not only in one and two dimensions, but also in the three-dimensional k-space.

In act IIh, on the basis of the k-space trajectory density $k_{dens}(k)$, the optimized k-space trajectory k(t) of the trajectory type kTT specified in act IIa is calculated. As an option before this, in act IIg, a sub-sampled k-space trajectory (e.g., within the scope of a TX-SENSE method) is produced. The k-space trajectory k(t) determined in act IIh is used, as already explained heretofore in connection with FIG. 2, in order to determine, in the method act III described there, the optimum high-frequency pulse sequence.

Hereinafter, on the basis of FIGS. 4 to 7, two diagrammatic examples are provided for the determination of optimized k-space trajectories.

Figure 4:
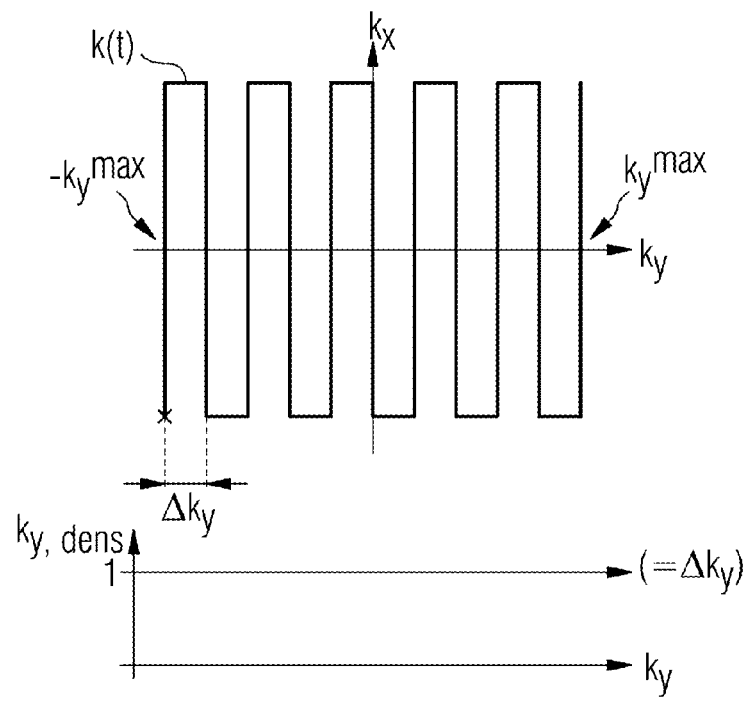
FIG. 4 shows a representation of a conventional geometry, uniformly dense in the y-direction, of a straight-line EPI trajectory (top illustration) with the k-space trajectory density relating to the straight-line EPI trajectory (bottom graphic) according to the prior art.
Figure 5:
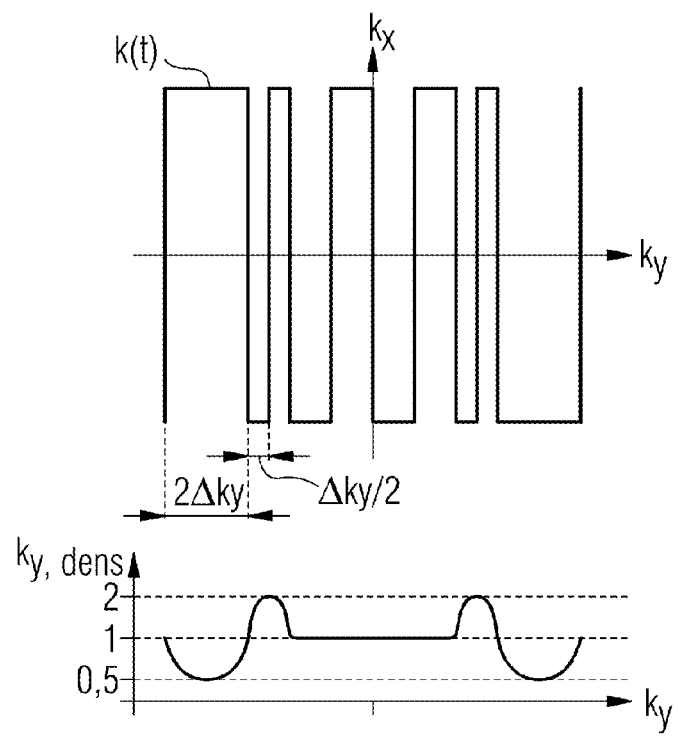
FIG. 5 shows a representation of the possible geometry of an optimized straight-line EPI trajectory determined by the method (top picture) with the k-space trajectory density relating to the optimized straight-line EPI trajectory (bottom graphic)

FIGS. 4 and 5 relate to a straight-line EPI trajectory.

FIG. 4 shows such an EPI trajectory according to the prior art. This trajectory is plotted in the two-dimensional k-space in an x-/y plane, where the direction for the y-gradient $k_y$ runs horizontally, and the direction for the x-gradient $k_x$ runs vertically. This arrangement is random, however. This traditional EPI trajectory runs from bottom left, at which the trajectory starts at the point in time t=0, initially in the x-direction upwards, then jumps by a step with the line interval spacing $\Delta k_y$ onwards into the y-direction, and then runs on parallel to the first line downwards. In this way, the k-space is run through in a meander-fashion, from a maximum $k_y$ value (e.g., the k-space maximum in the y-direction) in the negative direction $-k_y^{max}$ up to the same value in the positive direction $k_y^{max}$ (e.g., the origin of the k-space is in the middle (origin of the co-ordinate cross)). In one embodiment, the line interval spacing $\Delta k_y$ between the vertically running lines of the k-space trajectory is the same in each case over the entire length of the k-space trajectory (e.g., $\Delta k_y$ is constant) and is derived from the overall length of the k-space from the $-k_y^{max}$ to the point $k_y^{max}$ divided by the number of the lines $-1$. In the final analysis, the interval spacing $\Delta k_y$ is therefore determined by the number of the lines or, respectively, the field of excitation (FoE). Represented in the bottom graphic is the relative k-space density in the y-direction $k_{y,dens}$ (e.g., related to the value 1), which corresponds to a uniform interval spacing $\Delta k_y$.

In mathematical terms, the trajectory may be described as follows:

$$k(t) = (k_x(t), k_y(t)) \qquad (9)$$

In this situation, the components for a line of the trajectory in the x-direction is derived by:

$$k_X(t) = \frac{\gamma}{4\pi} \begin{cases} S_R(t+t_2)^2 - G_x(t_1 - t_2) & t \in [-t_2, -t_1) \\ 2 G_x t & t \in [-t_1, t_1) \\ 2 G_x t_1 + 2 S_R t_2(t+t_1) - 2 S_R(t_1^2 - t^2) & t \in [t_1, t_2) \end{cases} \qquad (10a)$$

In this situation, $G_x$ is the amplitude, and $S_R$ is the slew rate of the gradient in the x-direction, which in most cases runs in a trapezoid fashion over the time t (e.g., from a start point $-t_2$ with rising amplitude up to a point $-t_1$, then (on the "flat top" of the gradient pulse) with constant amplitude $G_x$ as far as the point in time $t_1$; from there, with falling amplitude, as far as the point in time $t_2$).

The components in the y-direction are provided by $$k_y(t) = -k_y^{max} \cdot i_1 \cdot \Delta k_y \cdot t_{esp} \qquad (10b)$$

$t_{esp}$ is the echo-spacing time, and $i_1$ is the line number of the lines running straight in the x-direction.

FIG. 5 shows, by way of comparison, a k-space trajectory optimized by the method.

In this respect, the relative k-space density is determined by the method in the y-direction $k_{y,dens}$, which is again represented in the graphic underneath. As is shown in FIG. 5, as early as at the beginning of the trajectory in the y-direction, the k-space density $k_{y,dens}$ falls to half, then rises to double the value, and in the middle range, is at the "normal" value of 1. Symmetrically to this, the same picture is shown in the positive y-range of the k-space. Corresponding to this k-space density $k_{y,dens}$, the lines of the trajectory k(t) are tighter precisely in the ranges with the higher density (e.g., precisely twice as close as in the middle range), and then spaced wider in the ranges with the lower density (e.g., precisely double as far apart from one another as in the middle range, or, respectively, in the traditional trajectory according to FIG. 4).

In mathematical terms, such a trajectory may be described by the equations (9) and (10a). The only consideration is that the equation (10b) is to be replaced by the following equation:

$$k_y(t) = -k_y^{max} \cdot i_1 \cdot \frac{1}{k_{dens}} \cdot t_{esp} \qquad (10b')$$

As is shown below on the basis of examples, via such an optimization of the k-space trajectory, substantially more exact excitation patterns may be produced.

Figure 6:
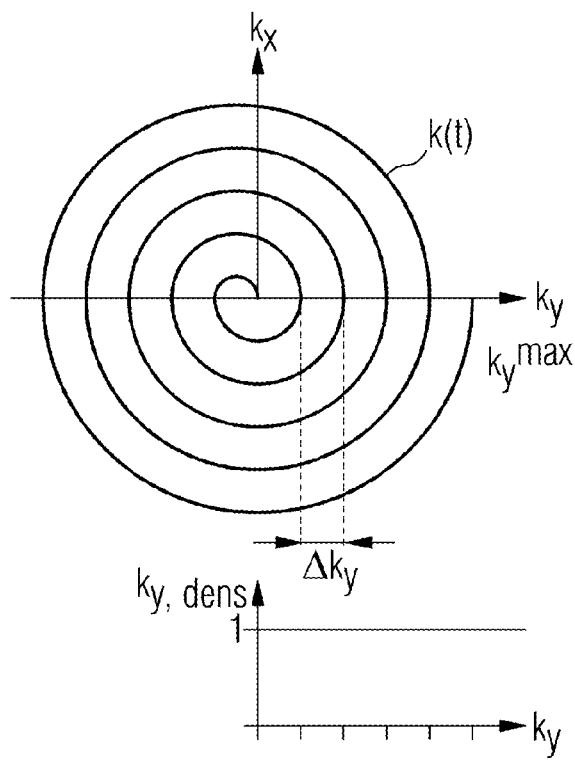
FIG. 6 shows a representation of the conventional geometry of a spiral-shaped k-space trajectory with uniform rise (top illustration) with the k-space trajectory density relating to the spiral-shaped k-space trajectory (bottom graphic) according to the prior art.
Figure 7:
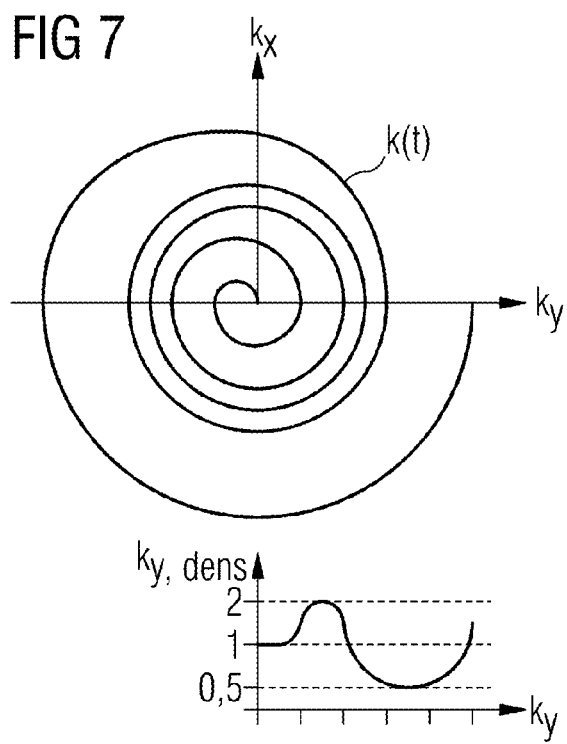
FIG. 7 shows a representation of the possible geometry of an optimized spiral-shaped k-space trajectory determined by one embodiment of the method (top illustration) with the k-space trajectory density relating to the optimized spiral-shaped k-space trajectory (bottom graphic)

FIGS. 6 and 7 show a similar example for a spiral trajectory. In this situation, FIG. 6 shows a spiral trajectory with a uniform rise (e.g., without the optimization). The trajectory begins in this case at the origin of the k-space co-ordinate system (e.g., in the k-space center) and makes five rotations until the trajectory reaches the maximum value $k_y^{max}$. Along the y-axis, the interval spacings between two revolutions are in each case the same (e.g., $\Delta k_y$). Mathematically, such spirals may be described in polar co-ordinates $\lambda, \theta$ in the k-space as follows:

$$k(t) = \lambda(t) \cdot \Theta(t) \qquad (11)$$

(e.g., $k_x = k \cdot \cos \theta$ and $k_y = k \cdot \cos \theta$). With this trajectory, too, the relative k-space density is plotted in the y-direction $k_{y,dens}$, which in this case is constant at a value 1.

By way of comparison, FIG. 7 shows a spiral-shaped trajectory with changing density along the y-direction. The relative density $k_{y,dens}$ is again entered in the is lower diagram, and above the lower diagram, the spiral is that, in the first instance, exhibits in the middle range, like the original spiral, a density $k_{y,dens}$ of 1, then a double density $k_{y,dens}$, and then initially becomes less dense outwards in order then to revert to the value 1 is represented. The rise is accordingly selected such that the density $k_{y,dens}$ of the lines, when intersecting the y-axis $k_y$, coincides according to the density $k_{y,dens}$ selected. Such a spiral may be described mathematically as follows:

$$k(t) = \lambda(t, k_{dens}) \cdot \Theta(t) \qquad (11')$$

where the first factor $\lambda(t, k_{dens})$ (e.g., with a known line interval spacing $\lambda k_y$ from rotation to rotation) may also be calculated numerically.

On the basis of FIGS. 8 to 12, the advantage of the method is explained once again.

In this respect, FIG. 8 shows a typical $B_0$ map $\Delta B_0$ for a phantom sphere. Represented in FIG. 8 are the off-resonances (e.g., the deviations of the actual magnetic resonance frequency present at the respective locations from the actually specified Larmor frequency), which, in an ideally homogeneous $B_0$ field, may be present at each location. The values are given, for example, in the conventional manner in Hertz, where the representation is provided in gray levels. The values of the gray levels may be read off on the scale to the side.

As shown in FIG. 8, this phantom exhibits considerable off-resonances.

Represented in FIG. 9 is a theoretically calculated target magnetization. In this phantom, only a middle strip is to be excited, with the most exact delimitations possible. The middle strip runs largely in a straight line vertically through the phantom.

FIG. 10 shows the magnetization actually attained with a non-optimized EPI sequence. Additionally, in FIG. 10, the actually planned target magnetization is drawn in as broken lines. As shows in FIG. 10, the substantial off-resonances have led to a substantial distortion of the magnetization actually attained.

In comparison with this, FIG. 11 shows the magnetization attained with an activation sequence that is based on a k-space trajectory optimized. In this situation, a method, with which only one transmission channel is excited, is used. The antenna is operated in a circular-polarizing (CP) mode.

FIG. 12 shows a further comparison with an optimized k-space trajectory, where the excitation is effected with two independent channels (e.g., a two-channel pTX method is used).

As FIGS. 11 and 12 show, in a very simple manner, a substantially better and more exact excitation of the desired target magnetization may be achieved with the method, and both may be achieved with simple excitation systems with only one channel as well as with pTX methods.

As shown overall by the experiments, the k-space trajectory determination method, on the basis of a deterministically-analytically calculated $B_0$ map-based error metric, in combination with the current target magnetization, offers a substantial improvement in relation to non-optimized excitation methods. In this situation, the method has the advantage that the method does not require any additional search optimizations, and may therefore be calculated especially rapidly and directly. No additional hardware is required either. Rather, the method may be implemented by suitable updates of the control software on a conventional magnetic resonance tomography system (e.g., also a single-channel magnetic resonance tomography system). The image and excitation quality is significantly improved, and errors due to $B_0$-inhomogeneities are substantially reduced.

The methods and arrangements described in detail heretofore are exemplary embodiments, and the basic principle may also be varied by the person skilled in the art within wide ranges without departing from the scope of the invention, inasmuch as is specified by the claims. The use of the indefinite article "a" or "an" does not exclude the possibility that the features concerned may also be present as a plurality. Likewise, the term "unit" does not exclude the possibility that this consists of several components, which, if appropriate, may also be spatially divided.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for the determination of a magnetic resonance system activation sequence comprising at least one high-frequency pulse sequence transmitted by a magnetic resonance system, the method comprising:
   acquiring a current $B_0$ map;
   acquiring a k-space trajectory type;
   calculating an error density in k-space on the basis of the current $B_0$ map using an analytical function that defines an error density in the k-space as a function of the current $B_0$ map;
   determining a k-space trajectory of the acquired k-space trajectory type taking account of the error density in the k-space; and
   determining the at least one high-frequency pulse sequence for the k-space trajectory in an HF pulse optimization process.

2. The method as claimed in claim 1, further comprising acquiring a target magnetization.

3. The method as claimed in claim 2, wherein calculating the error density comprises calculating the error density on the basis of the current $B_0$ map and the target magnetization.

4. The method as claimed in claim 1, further comprising determining, on the basis of the current $B_0$ map, a phase error map,
   wherein calculating the error density in the k-space comprises calculating the error density based on the phase error map.

5. The method as claimed in claim 1, wherein the magnetic resonance system activation sequence comprises a multi-channel pulse sequence with a plurality of individual high frequency (HF) pulse sequences to be transmitted in parallel by the magnetic resonance system via a plurality of different independent high-frequency transmission channels.

6. The method as claimed in claim 1, wherein determining the k-space trajectory comprises determining the k-space trajectory such that the k-space, at activation of the magnetic resonance system, is sub-sampled with the aid of the magnetic resonance system activation sequence.

7. The method as claimed in claim 6, wherein the k-space is sub-sampled at least area by area in a regular pattern.

8. The method as claimed in claim 6, wherein the k-space is sub-sampled at least area by area in an irregular pattern, at random, or in an irregular and random pattern.

9. The method as claimed in claim 1, wherein determining the k-space trajectory comprises determining the k-space trajectory based on at least one examination-specific parameter, at least one device-specific parameter, or at least one examination-specific parameter and at least one device-specific parameter.

10. The method as claimed in claim 9, wherein determining the k-space trajectory comprises determining the k-space trajectory based on the at least one device-specific parameter, and
    wherein the at least one device-specific parameter comprises number of transmission channels, maximum gradient amplitude, or maximum gradient slew rate.

11. The method as claimed in claim 1, further comprising reacquiring, during a measurement, the current $B_0$ map; and
    redetermining, based on the reacquired current $B_0$ map, the k-space trajectory for the magnetic resonance system activation sequence used subsequently in the measurement.

12. A method for the operation of a magnetic resonance system, the method comprising:
    determining an activation sequence comprising at least one high-frequency pulse sequence transmitted by a magnetic resonance system, the determining comprising:
      acquiring a current $B_0$ map;
      acquiring a k-space trajectory type;
      calculating an error density in k-space on at least the basis of the current $B_0$ map using an analytical function that defines an error density in the k-space as a function of the current $B_0$ map;
      determining a k-space trajectory of the acquired k-space trajectory type taking account of the error density in the k-space; and
      determining the at least one high-frequency pulse sequence for the k-space trajectory in an HF pulse optimization process; and
    operating the magnetic resonance system under the use of the determined activation sequence.

13. A control sequence determination device operable to determine a magnetic resonance system activation sequence comprising at least one high-frequency pulse sequence to be transmitted by a magnetic resonance system, the control sequence determination device comprising:
    an input interface arrangement operable to acquire:
      a current $B_0$ map;
      a k-space trajectory type; and
      a target magnetization;
    an error density calculation unit operable to calculate an error density in a k-space based on the current $B_0$ map using an analytical function that defines a $B_0$ field error density in the k-space as a function of the current $B_0$ map;
    a trajectory determination unit operable to determine a k-space trajectory of the acquired k-space trajectory type taking account of the $B_0$ field error density in the k-space; and
    a high frequency (HF) pulse optimization unit operable to determine the at least one high-frequency pulse sequence for the k-space trajectory.

14. The control sequence determination device as claimed in claim 13, wherein the error density calculation unit is operable to calculate the error density based on the target magnetization.

15. The control sequence determination device as claimed in claim 14, wherein the analytical function defines the $B_0$ field error density in the k-space as a function of the target magnetization.

16. A magnetic resonance system comprising:
    a high-frequency transmission device comprising a gradient system and a control unit, the high-frequency transmission device configured to:
      transmit a high-frequency pulse sequence in order to carry out a desired measurement on the basis of a specified activation sequence; and
      coordinated with the transmission of the high-frequency pulse sequence, transmit, via the gradient system, a gradient pulse sequence; and
    a control sequence determination device operable to determine the activation sequence, the activation sequence comprising at least one high-frequency pulse sequence, and operable to transmit the activation sequence to the control unit, the control sequence determination device comprising:
      an input interface arrangement operable to acquire:
        a current $B_0$ map;

a k-space trajectory type; and
a target magnetization;
an error density calculation unit operable to calculate an error density in a k-space based on the current $B_0$ map using an analytical function that defines a $B_0$ field error density in the k-space as a function of the current $B_0$ map; and
a trajectory determination unit operable to determine a k-space trajectory of the acquired k-space trajectory type taking account of the $B_0$ field error density in the k-space; and
a high frequency (HF) pulse optimization unit operable to determine the at least one high-frequency pulse sequence for the k-space trajectory.

17. The magnetic resonance system as claimed in claim 16, wherein the error density calculation unit is operable to calculate the error density based on the target magnetization.

18. The magnetic resonance system as claimed in claim 16, wherein the analytical function defines the $B_0$ field error density in the k-space as a function of the target magnetization.

19. A computer program that is loadable directly into a non-transitory computer-readable medium of a control sequence determination device, the computer program including instructions that are executable by the control sequence determination device, the instructions comprising:

acquiring a current $B_0$ map;

acquiring a k-space trajectory type;

calculating an error density in k-space on the basis of the current $B_0$ map using an analytical function that defines an error density in the k-space as a function of the current $B_0$ map;

determining a k-space trajectory of the acquired k-space trajectory type taking account of the error density in the k-space; and determining at least one high-frequency pulse sequence for the k-space trajectory in an HF pulse optimization process.

* * * * *